(12) United States Patent
Sasaoka et al.

(10) Patent No.: US 9,406,856 B2
(45) Date of Patent: Aug. 2, 2016

(54) PACKAGE FOR LIGHT EMITTING APPARATUS AND LIGHT EMITTING APPARATUS INCLUDING THE SAME

(71) Applicant: NICHIA CORPORATION, Anan-shi (JP)

(72) Inventors: Shimpei Sasaoka, Tokushima (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/315,332

(22) Filed: Jun. 26, 2014

(65) Prior Publication Data

US 2015/0001559 A1    Jan. 1, 2015

(30) Foreign Application Priority Data

Jun. 28, 2013  (JP) ................. 2013-136421
Apr. 25, 2014  (JP) ................. 2014-090906

(51) Int. Cl.
*H01L 33/00*    (2010.01)
*H01L 33/62*    (2010.01)
*H01L 25/13*    (2006.01)
(Continued)

(52) U.S. Cl.
CPC ............... *H01L 33/62* (2013.01); *H01L 25/13* (2013.01); *H01L 33/486* (2013.01); *H01L 25/0753* (2013.01); *H01L 2224/45144* (2013.01); *H01L 2224/48091* (2013.01); *H01L 2224/48247* (2013.01); *H01L 2224/49107* (2013.01)

(58) Field of Classification Search
CPC ... H01L 25/13; H01L 25/0753; H01L 33/486; H01L 33/62

USPC .......................... 257/88, 98, 99, 100
See application file for complete search history.

(56) References Cited

U.S. PATENT DOCUMENTS

| | | |
|---|---|---|
| 5,874,748 A | 2/1999 | Osawa |
| 7,282,785 B2 | 10/2007 | Yoshida |
| 7,675,145 B2 | 3/2010 | Wong et al. |

(Continued)

FOREIGN PATENT DOCUMENTS

| | | |
|---|---|---|
| JP | 09-321344 | 12/1997 |
| JP | 2003-110145 | 4/2003 |

(Continued)

OTHER PUBLICATIONS

Extended European Search Report for corresponding EP Application No. 14174566.1-1551, Nov. 6, 2014.

(Continued)

*Primary Examiner* — Tan N Tran
(74) *Attorney, Agent, or Firm* — Mori & Ward, LLP

(57) ABSTRACT

The present invention provides a package for light emitting apparatus has a long-length direction and a short-length direction perpendicular to the long-length direction as viewed in plan view, and includes first, second and third leadframes, and a resin portion. The first and second leadframes are arranged on the both sides in the long-length direction. The third leadframe is arranged between the first and second leadframes. The resin portion is integrally formed with the first, second and third leadframes. The first and second leadframes include main portions, and first and second extension portions that extend from the main portions toward the second and first leadframes, respectively, and have a width smaller than the main portions.

20 Claims, 5 Drawing Sheets

(51) Int. Cl.
*H01L 33/48* (2010.01)
*H01L 25/075* (2006.01)

(56) References Cited

U.S. PATENT DOCUMENTS

| | | |
|---|---|---|
| 2003/0075724 A1 | 4/2003 | Wang et al. |
| 2004/0056265 A1 | 3/2004 | Arndt et al. |
| 2005/0280017 A1 | 12/2005 | Oshio et al. |
| 2006/0170083 A1 | 8/2006 | Kim et al. |
| 2008/0042151 A1 | 2/2008 | Oh et al. |
| 2008/0151557 A1 | 6/2008 | Su et al. |
| 2008/0210964 A1 | 9/2008 | Tomioka |
| 2010/0314654 A1 | 12/2010 | Hayashi |
| 2011/0186875 A1 | 8/2011 | Egoshi et al. |
| 2011/0215349 A1 | 9/2011 | An et al. |
| 2011/0220927 A1 | 9/2011 | Min |
| 2012/0025260 A1 | 2/2012 | Oonakahara et al. |
| 2012/0112227 A1 | 5/2012 | Toyama |
| 2013/0087817 A1 | 4/2013 | An et al. |
| 2013/0127034 A1 | 5/2013 | Hasegawa et al. |
| 2013/0299854 A1 | 11/2013 | Lee et al. |
| 2014/0054629 A1 | 2/2014 | Kim |
| 2014/0117403 A1 | 5/2014 | Hayashi |
| 2014/0183574 A1 | 7/2014 | Nakabayashi et al. |
| 2014/0239321 A1 | 8/2014 | Lu et al. |

FOREIGN PATENT DOCUMENTS

| | | |
|---|---|---|
| JP | 2005-353914 | 12/2005 |
| JP | 3130684 | 4/2007 |
| JP | 3140772 U | 4/2008 |
| JP | 2011-134902 | 7/2011 |
| JP | 2011-159837 | 8/2011 |
| JP | 2011-176264 | 9/2011 |
| JP | 2011-248807 | 12/2011 |
| JP | 2011-254080 | 12/2011 |
| JP | 2012-151436 | 8/2012 |
| JP | 2012/182485 | 9/2012 |
| JP | 2012-190970 | 10/2012 |
| JP | 2012-195430 | 10/2012 |
| JP | 2012-209377 | 10/2012 |
| KR | 10-2012-0001189 | 1/2012 |
| KR | 10-1116951 B1 | 3/2012 |
| WO | 02/17401 | 2/2002 |
| WO | 2008/081794 | 7/2008 |
| WO | 2008/156020 | 12/2008 |
| WO | 2012/014382 | 2/2012 |

OTHER PUBLICATIONS

Notice of Allowance issued by the U.S. Patent and Trademark Office for the corresponding U.S. Appl. No. 14/064,200, Oct. 8, 2015.
Office Action with Form PTO-892 Notice of References U.S. Patent and Trademark Office for the co-pending U.S. Appl. No. 14/064,200, Feb. 2, 2015.
Office Action issued by the U.S. Patent and Trademark Office for the co-pending U.S. Appl. No. 14/064,200, Jun. 29, 2015.
Extended European Search Report for corresponding EP Application No. 13199679.1-1551, Mar. 13, 2014.
Office Action with Form PTO-892 Notice of References U.S. Patent and Trademark Office for the co-pending U.S. Appl. No. 14/141,429, Feb. 23, 2015.
Notice of Allowance issued by the U.S. Patent and Trademark Office for the co-pending U.S. Appl. No. 14/141,429, Jun. 3, 2015.
Notice of Allowance issued by the U.S. Patent and Trademark Office for the co-pending U.S. Appl. No. 14/141,429, Sep. 15, 2015.

PACKAGE FOR LIGHT EMITTING APPARATUS AND LIGHT EMITTING APPARATUS INCLUDING THE SAME

BACKGROUND OF THE INVENTION

1. Field of the Invention

The present invention relates to a package for light emitting apparatus (hereinafter, occasionally referred to as "package"), and a light emitting apparatus.

2. Description of the Related Art

For example, a surface mount device (SMD) type light emitting diode (LED) is disclosed in Japanese Patent Laid-Open Publication No. JP 2011-134,902 A.

This surface mount device (SMD) type light emitting diode (LED) is produced by using a package for light emitting apparatus. The package for light emitting apparatus includes two leadframes, and a resin case that has a recessed portion and is integrally formed with the two leadframes. LED chips are placed in the recessed portion, and covered with sealing resin.

However, in the known package for light emitting apparatus disclosed in JP 2011-134,902 A, shocks or loads from the outside, or some ambient temperature may cause occurrence of crack or fracture in the resin case, or detachment of the resin case from the leadframe, which in turn cannot provide sufficient long-term reliability. Such a problem is likely to arise particularly in package for light emitting apparatus having a long and narrow shape.

Therefore, the present invention is aimed at the above problem, and its object is to provide a package for light emitting apparatus with high reliability, and a light emitting apparatus including the package.

SUMMARY OF THE INVENTION

To achieve the above object, a package for light emitting apparatus according to the present invention is provided which has a long-length direction and a short-length direction perpendicular to the long-length direction as viewed in plan view, and includes first, second and third leadframes, and a resin portion. The first and second leadframes are arranged on the both sides in the long-length direction. The third leadframe is arranged between the first and second leadframes. The resin portion is integrally formed with the first, second and third leadframes. The first leadframe includes a main portion, and a first extension portion that extends from the main portion toward the second leadframe and has a width reduced from the main portion of the first leadframe. The second leadframe includes a main portion, and a second extension portion that extends from the main portion toward the first leadframe and has a width reduced from the main portion of the second leadframe. The first and second extension portions face the third leadframe in the short-length direction as viewed in plan view.

Also, a package for light emitting apparatus according to the present invention is provided which has a long-length direction and a short-length direction perpendicular to the long-length direction as viewed in plan view, and includes first and second leadframes, and a resin portion. The first and second leadframes are arranged on the both sides in the long-length direction. The resin portion is integrally formed with the first and second leadframes. A recessed portion for accommodating a light emitting device is formed by the resin portion, and the first and second leadframes. The first leadframe includes a main portion, and a third extension portion. The third extension portion extends from the main portion of the first leadframe toward the second leadframe, and has a width smaller than the main portion of the first leadframe. The third extension portion is embedded in the resin portion so that the third extension portion is exposed neither on the exterior side of the package nor in the recessed portion.

Also, a package for light emitting apparatus according to the present invention is provided which has a long-length direction and a short-length direction perpendicular to the long-length direction as viewed in plan view, and includes first, second and third leadframes, and a resin portion. The first and second leadframes are arranged on the both sides in the long-length direction. The third leadframe is arranged between the first and second leadframes. The resin portion is integrally formed with the first, second and third leadframes. A recessed portion for accommodating a light emitting device is formed by the resin portion, and the first, second and third leadframes. At least one of the first and third leadframes includes a first embedded extension portion that extends between the first and third leadframes and has a width smaller than the main portion of the first leadframe or the maximum width of the third leadframe. The first embedded extension portion is embedded in the resin portion so that the first embedded extension portion is exposed neither on the exterior side of the package nor in the recessed portion.

A package for light emitting apparatus according to the present invention enhances to improve resistance to a stress that is loaded on a part in proximity to the spaced area between the first and second leadframes. Accordingly, the package for light emitting apparatus enhances to suppress crack or fracture in the resin portion, or detachment of the resin portion. Therefore, a package with high reliability can be provided. Also, a light emitting apparatus with high reliability can be produced by using the package.

The above and further objects of the present invention as well as the features thereof will become more apparent from the following detailed description to be made in conjunction with the accompanying drawings.

DETAILED DESCRIPTION OF THE EMBODIMENT(S)

The following description will describe embodiments according to the present invention with reference to the drawings. It should be appreciated, however, that the embodiments described below are illustrations of a package for light emitting apparatus and a light emitting apparatus including the package of the present invention to give a concrete form to technical ideas of the invention, and a package for light emitting apparatus and a light emitting apparatus including the package of the present invention are not specifically limited to description below. In addition, the description for one embodiment may be applied to other embodiments or examples. Additionally, the sizes and the arrangement relationships of the members in each of the drawings are occasionally shown larger exaggeratingly for ease of explanation.

First Embodiment

Figure 1A:
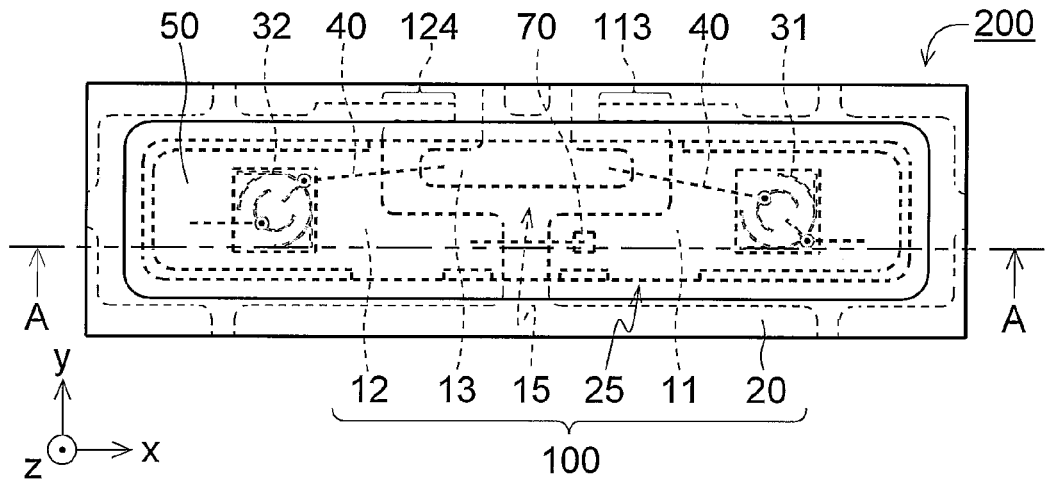
FIG. 1A is a schematic plan view schematically showing a light emitting apparatus according to an embodiment of the present invention.
Figure 1B:
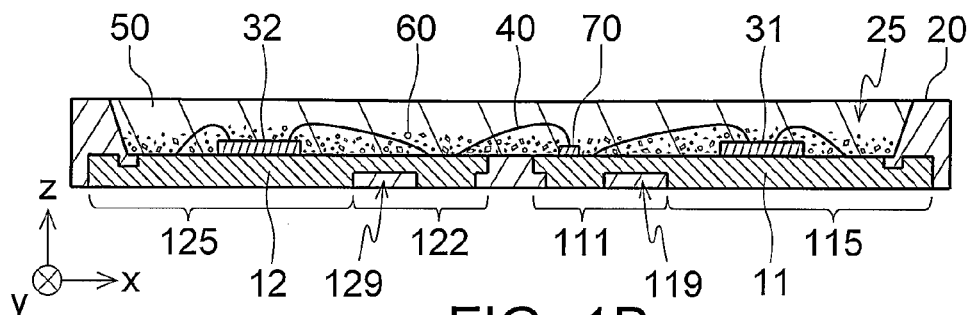
FIG. 1B is a schematic cross-sectional view of the light emitting apparatus taken along the line A-A shown in FIG. 1A.
Figure 1C:
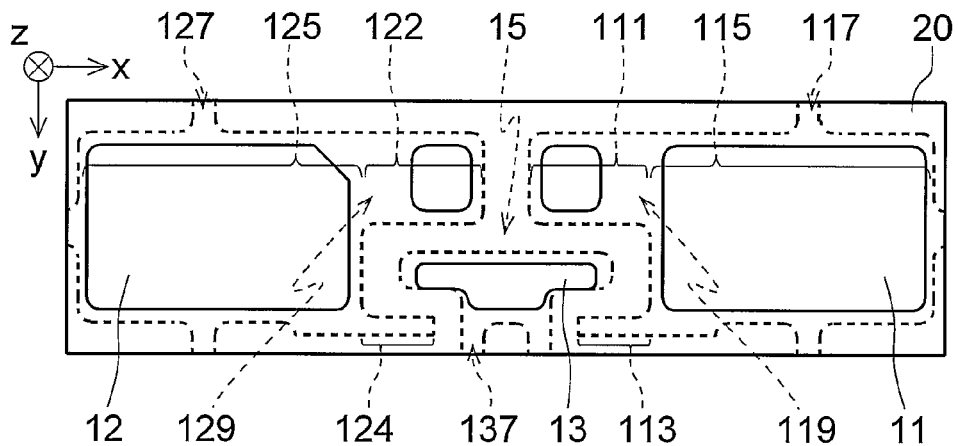
FIG. 1C is a schematic bottom view of the light emitting apparatus.

FIGS. 1A and 1C are schematic top (plan) and bottom views schematically showing a light emitting apparatus 200 according to a first embodiment of the present invention, respectively. FIG. 1B is a schematic cross-sectional view of the light emitting apparatus 200 taken along the line A-A shown in FIG. 1A.

As shown in FIGS. 1A to 1C, the light emitting apparatus 200 according to the first embodiment includes a package for light emitting apparatus 100 shown in FIGS. 1A to 1C, light emitting devices 31 and 32, and a sealing member 50. The light emitting devices are arranged in the package for light emitting apparatus, and are covered with the sealing member. The sealing member 50 according to this embodiment contains phosphor 60. However, the phosphor may be omitted.

As shown in FIGS. 1A to 1C, the package 100 has a long shape extending in one direction as viewed in plan view. In other words, the package 100 has a long-length direction and a short-length direction perpendicular to the long-length direction as viewed in plan view. More specifically, the long-length direction is parallel to the end surface of a leadframe that extends in the package long-length direction, that is, to the end surface of the leadframe that terminates in the short-length direction. In the drawings, the long-length, short-length and vertical directions of the package are indicated as x, y and z directions, respectively. Also, x, y and z directions are occasionally referred to as transverse, height and thickness directions, respectively.

As shown in FIGS. 1A to 1C, the package 100 includes first, second and third leadframes 11, 12 and 13, and a resin portion 20 that is integrally formed with the first, second and third leadframes. The first and second leadframes 11 and 12 are arranged on the both sides in the long-length direction of the package 100. The third leadframe 13 is arranged between the first and second leadframes 11 and 12. Similar to the package 100, the first, second and third leadframes 11, 12 and 13 have long shapes extending in the long-length direction of the package. The first, second and third leadframes 11, 12 and 13 have a plate shape, and are not subjected substantial bending. The first, second and third leadframes 11, 12 and 13 are spaced away from each other so that a spaced area 15 is formed. The spaced area is filled with the resin portion 20. The spaced area 15 serves as an electrically insulating area. Thus, the leadframes are integrally held with the resin portion 20. The light emitting devices are arranged on the upper surface side of the package 100. In the description, although the right and left leadframes in the drawings are referred to as the first and second leadframes 11 and 12, respectively, the left and right leadframes in the drawings can be referred to as the first and second leadframes.

The resin portion 20 has an elongated rectangular shape extending in the long-length direction of the package as viewed in plan view. The resin portion 20 covers the end surfaces of the first, second and third leadframes 11, 12 and 13 (except the hanger lead portions 117, 127 and 137). Also, the resin portion 20 covers parts of the upper surfaces of the first, second and third leadframes 11, 12 and 13 (in particular, the peripheral edge parts). In addition, a recessed portion 25 for accommodating light emitting devices 31 and 32 is formed by the resin portion 20 together with the first, second and third leadframes 11, 12 and 13. Specifically, the bottom surface of the recessed portion 25 is mainly formed by the upper surfaces of the first, second and third leadframes 11, 12 and 13, and the surface of the resin portion 20 with which the spaced area 15 is filled. In this embodiment, although the bottom surface of the recessed portion 25 is substantially flat, protrusion may be provided on the spaced area 15, for example. In order that light emitted from the light emitting devices can be efficiently outgo, it is preferable that the protrusion become wider toward the bottom surface of the recessed portion 25. The protrusion can be integrally formed with the resin portion 20, or be provided as separated member from the resin portion 20. The side wall surfaces of the recessed portion 25 are formed by the surfaces of the resin portion 20. Although the side wall surfaces of the recessed portion 25 may extend perpendicular to the bottom surface of the recessed portion 25, it is preferable that the side wall surfaces be inclined so that the opening area of the recessed portion becomes smaller toward the part bottom surface of the recessed portion 25 in order that light emitted from the light emitting device can efficiently outgo. Although the package includes the recessed portion 25 in this embodiment, the recessed portion 25 may be omitted, in other words, the recessed portion side wall surfaces may be omitted. For example, the package can have a plate shape.

The first leadframe 11 includes a first extension portion 111 that extends toward the second leadframe 12, and has a smaller width. Also, the second leadframe 12 includes a second extension portion 122 that extends toward the first leadframe 11, and has a smaller width. More specifically, the first leadframe 11 includes a first main portion 115. The first extension portion 111 extends from the first main portion 115 toward the second leadframe 12. The width of the first extension portion is smaller than (reduced from) the width of the main portion of the first leadframe. The upper surfaces of the first main portion 115 and the first extension portion 111 serve as parts of the bottom surface of the recessed portion 25. The second leadframe 12 includes a second main portion 125. The second extension portion 122 extends from the second main portion 125 toward the first leadframe 11. The width of the second extension portion is smaller than the width of the main portion of the second leadframe. The upper surfaces of the second main portion 125 and the second extension portion 122 serve as parts of the bottom surface of the recessed portion 25. The first and second extension portions 111 and 122 face the third leadframe 13 in the short-length direction as viewed in plan view.

Here, it can be considered that the first and second main portions 115 and 125 are main parts of the leadframes 11 and 12 including the upper surface areas on which the light emitting devices are arranged. The widths (the lengths in the short-length direction) of the first and second extension portions 111 and 122 can be substantially constant or be varied. It can be considered that the boundaries between the first main portion 115 and the first extension portion 111, and between the second main portion 125 and the second extension portion 122 are straight lines that are parallel to the short-length direction and pass through the width-changing points. The same goes for third and fourth extension portions 113 and 124 (discussed later).

Although the first and second leadframes 11 and 12 may have different maximum widths (the maximum widths in the short-length direction, for example, the widths of the first and second main portions 115 and 125), the first and second leadframes preferably have substantially the same maximum width. Although the first and second leadframes 11 and 12 may be arranged in a slanting direction from viewpoint at the center lines of the first and second main portions 115 and 125 as viewed in plan view, the first and second leadframes are preferably arranged substantially in parallel from the viewpoint at the center lines. Although the first and second leadframes 11 and 12 may be positioned at deviated positions from each other in the short-length direction from viewpoint at the center lines of the first and second main portions 115 and 125 as viewed in plan view, the first and second leadframes are preferably arranged substantially in the same position in the short-length direction.

In the thus-constructed package 100, the first and second extension portions 111 and 122 face the third leadframe 13 in the short-length direction as viewed in plan view. Accordingly, the spaced area 15 among the first, second and third leadframes 11, 12 and 13 has a shape without a linear transverse part that extends along a straight line in parallel to the short-length direction as viewed in plan view. For this reason, it promotes to improve the resistance of the package 100 to a stress that is loaded on the spaced area 15 and its surroundings (e.g., a force that is loaded on the spaced area 15 and bends the package 100) as compared with a shape with a linear transverse part that extends along a straight line in parallel to the short-length direction.

The upper surface of the third leadframe 13 can serve as a wire-to-wire connection area through which wire lines serially connects the light emitting devices arranged on the first and second leadframes 11 and 12 to each other. Also, the first and second extension portions 111 and 122 can serve as a mounting area for mounting a protection device or the like, and a wire connection area onto which a wire line is connected from the protection device or the like. According to this construction, the wire lines can be relatively short, which in turn can reduce light absorption by the wire lines. Therefore, this construction enhances to improve the outgoing efficiency of light. As discussed above, the upper surface of the third leadframe 13, and the upper surfaces of the first and second extension portions 111 and 122, which are arranged in proximity to the spaced area 15, serve as the wire connection areas. For this reason, it is important to improve the resistance of the package 100 to a stress that is loaded on the spaced area 15 and its surroundings from viewpoint of suppressing wire disconnection.

The package for light emitting apparatus 100 and the light emitting apparatus 200 according to the preferred embodiment are now described.

In the package 100 shown in FIGS. 1A to 1O, the first and second extension portions 111 and 122 are arranged on the same side in the short-length direction that is opposite to the third leadframe 13. In other words, the first and second extension portions 111 and 122 are arranged on the same long edge side (only a first long edge side (one of the long edges opposed to each other)) of the package 100 as viewed in plan view. This arrangement can enhance to improve the resistance the package 100 to a stress that is loaded on the spaced area 15 and its surroundings while suppressing increase in width in the short-length direction of the package 100 whereby producing a small package. Also, this arrangement assists the upper surfaces of the first and second extension portions 111 and 122 to serve as the mounting area for mounting a protection device or the like, and the wire connection area onto which a wire line is connected from the protection device or the like. As a result, the wire line from the protection device or the like onto the wire connection area can be easily short. In the illustrated embodiment, although the extension lengths of the first and second extension portions 111 and 122 toward the third leadframe 13 are substantially equal to each other. However, the spaced part between the first and second extension portions may be offset (one of the extension lengths of the first and second extension portions may be longer than another).

In the package 100 shown in FIGS. 1A to 1O, the first leadframe 11 includes the third extension portion 113, which extends toward the second leadframe 12 and has a smaller width so that the third leadframe 13 is interposed between the first and third extension portions 111 and 113 in the short-length direction. Also, the second leadframe 12 includes the fourth extension portion 124, which extends from toward the first leadframe 11 and has a smaller width so that the third leadframe 13 is interposed between the second and fourth extension portions 122 and 124 in the short-length direction. This arrangement can further reinforce the periphery of the third leadframe 13, and can enhance to further improve the resistance the package 100 to a stress that is loaded on the spaced area 15 and its surroundings.

In the package 100 shown in FIG. 1A to 1C, the third and fourth extension portions 113 and 124 are embedded in the resin portion 20, in other words, the third and fourth extension portions are exposed neither on the exterior side of the package 100 (resin portion 20) nor in the recessed portion 25. More specifically, the third and fourth extension portions 113 and 124 are embedded right under the recessed portion side wall in the resin portion 20. According to this construction, the third and fourth extension portions 113 and 124 can provide a high reinforcement effect in the spaced area 15 and its surroundings. It is preferable that the third and fourth extension portions 113 and 124 be narrower than the first and second extension portions 111 and 122, respectively, as in this embodiment. The reason is that the third and fourth extension portions can be easily embedded in the resin portion 20. The third and fourth extension portions 113 and 124 are not limited to this arrangement. For example, the bottom surfaces of the third and fourth extension portions may be partially exposed to the exterior side of the package 100 (resin portion 20) or in the recessed portion 25.

In the package 100 shown in FIGS. 1A to 1C, the third leadframe 13 is arranged substantially in the center of the package. In this embodiment, since the third leadframe 13 is arranged substantially in the center of the package, the light emitting devices can be easily placed onto both the first and second leadframes 11 and 12, and preferred light distribution properties can be easily obtained. On the other hand, since the extension lengths of the first and second leadframe 11 and 12 from the spaced area 15 in the package central part are substantially equal to each other, a stress is likely to be loaded on the spaced area 15. However, according to the construction of the present invention, the spaced area can be reinforced.

In the package 100 shown in FIGS. 1A to 1C, the bottom surfaces of the first, second and third leadframes 11, 12 and 13 serve together with the bottom surface of the resin portion 20 as the bottom surface of the package for light emitting apparatus 100. According to this construction, the bottom surfaces of the first and second leadframes 11 and 12 can serve as mount surfaces in the package 100. As a result, heat can be efficiently dissipated from the first and second leadframes 11 and 12. Therefore, it enhances to suppress deterioration of the resin portion 20 and detachment of the resin portion from the leadframes, and to improve heat dissipation properties from the light emitting devices 31 and 32 or the protection device 70. In addition, it enhances to provide a thin package.

In the package 100 shown in FIGS. 1A to 1C, the first and second leadframes 11 and 12 have recessed parts that are arranged in the upper surfaces of the first and second extension portions 111 and 122, respectively. The recessed parts are filled with the resin portion 20. This construction enhances to improve the adhesive strength of the resin portion 20 to the first and second extension portions 111 and 122, and to suppress detachment of the resin portion 20 from the first and second leadframes 11 and 12. Although the recessed parts can have a dotted or dashed line shape as viewed in plan view, the recessed parts preferably have a straight line shape extending in the long-length direction. The reason is that the recessed parts can be effectively formed small in a relatively small area. Although the recessed parts can have a semicircular, rectangular or inverted-trapezoidal cross-sectional shape, or other shape, the recessed parts preferably have an inverted-triangular shape (V shape). The reason is that the recessed parts can be easily formed. In addition, as in this embodiment, the recessed parts may be formed in the upper surfaces other than the upper surfaces of the first and second extension portions 111 and 122 (e.g., the upper surfaces of the first and second main portions 115 and 125).

In the package 100 shown in FIGS. 1A to 1C, recessed parts 119 and 129 are provided in the bottom surfaces of the first and second extension portions 111 and 122, respectively. Also, the recessed parts 119 and 129 are filled with the resin portion 20. Accordingly, the exposed area of the bottom surface of the first extension portion 111 is separated from the exposed area of the bottom surface of the first main portion 115 by the resin portion 20 with which the recessed part 119 is filled. Similarly, the exposed area of the bottom surface of the second extension portion 122 is separated from the exposed area of the bottom surface of the second main portion 125 by the resin portion 20 with which the recessed part 129 is filled. This construction enhances to improve the symmetry of the exposed areas of the bottom surfaces of the leadframes and evenness of the areas of the exposed areas of the bottom surfaces of the leadframes, and to suppress unevenness of conductive paste amounts on the exposed areas of the bottom surfaces of the leadframes when the package 100 (light emitting apparatus 200) is mounted, which in turn can suppress that the package 100 is mounted in a tilted orientation. In addition, this construction can assist to improve self-alignment properties of the package 100.

The light emitting apparatus 200 shown in FIGS. 1A to 1C includes the package for light emitting apparatus 100, the first and second light emitting devices 31 and 32, which are arranged on the upper surfaces of the first and second leadframes 11 and 12, respectively. As discussed above, since the package for light emitting apparatus 100 has high reliability, a light emitting apparatus with high reliability can be provided by using the package. In addition, since the first and second light emitting devices 31 and 32 are arranged on the first and second leadframes 11 and 12, respectively, this arrangement assists to provide a sufficient distance between the first and second light emitting devices 31 and 32, which in turn facilitates control of intensity distribution.

In the light emitting apparatus 200 shown in FIGS. 1A to 1C, the first and second light emitting device 31 and 32 are arranged on the upper surfaces of the first and second main portions 115 and 125 of the first and second leadframes in the package 100, respectively. The first and second light emitting devices 31 and 32 are connected to the upper surface of the third leadframe 13 through wire lines 40. According to this construction, since the third leadframe 13 is provided in the package 100, even if the distance between the first and second light emitting devices 31 and 32 is large, the wire lines 40 for serially connecting the first and second light emitting devices 31 and 32 to each other can be relatively short, which in turn can reduce light absorption by the wire lines 40. Therefore, this construction enhances to improve the outgoing efficiency of light.

The light emitting apparatus 200 shown in FIGS. 1A to 1C includes the protection device 70, which is arranged on the upper surface of the first extension portion 111, and is connected to the upper surface of the second extension portion 122 through the wire line 40. According to this construction, the wire lines 40 for connecting the protection device 70 to the leadframe can be relatively short, which in turn can reduce light absorption by the wire line 40. Therefore, this construction enhances to improve the outgoing efficiency of light. Also, since the first and second extension portions 111 and 122 are arranged in the central part of the package 100, this arrangement assists to provide a sufficient distance between the light emitting devices 31 and 32, and the protection device 70, which in turn can reduce light absorption by the protection device 70. Therefore, this arrangement enhances to improve the outgoing efficiency of light.

Second Embodiment

Figure 2A:
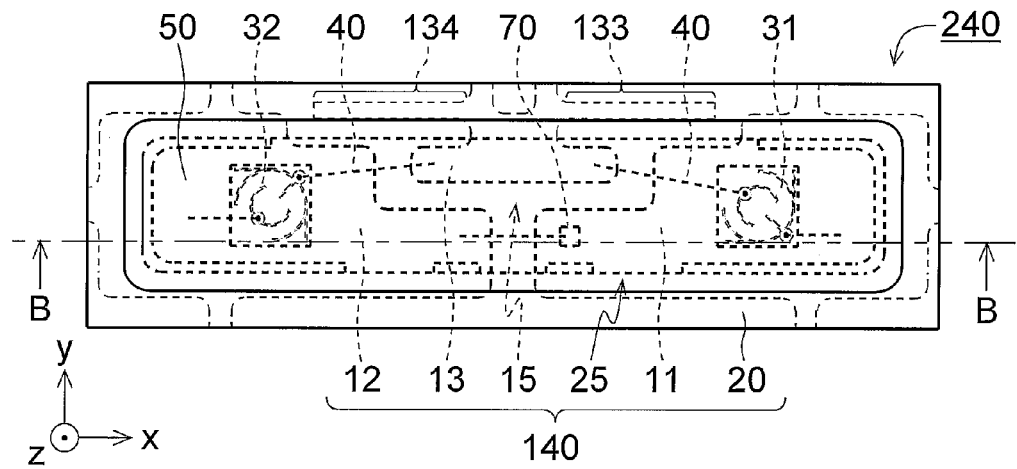
FIG. 2A is a schematic plan view schematically showing a light emitting apparatus according to an embodiment of the present invention.
Figure 2B:
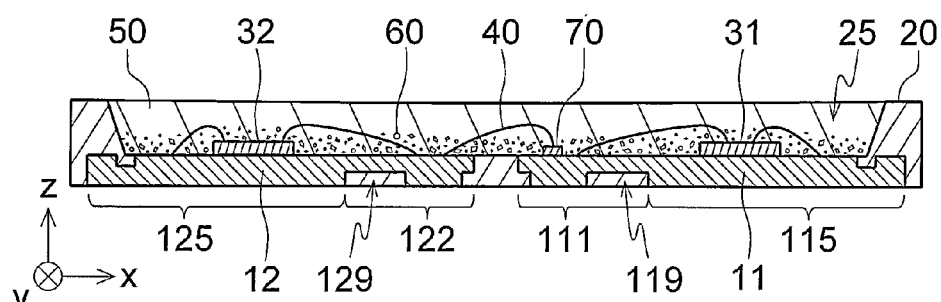
FIG. 2B is a schematic cross-sectional view of the light emitting apparatus taken along the line B-B shown in FIG. 2A.
Figure 2C:
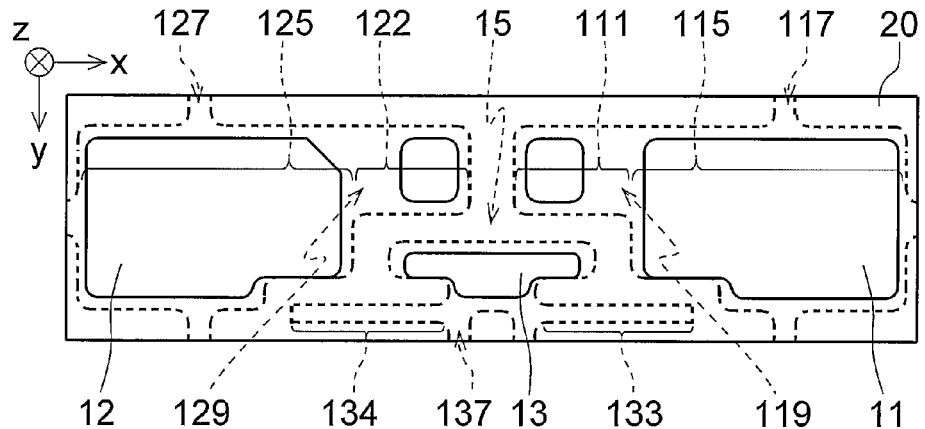
FIG. 2C is a schematic bottom view of the light emitting apparatus.

FIGS. 2A and 2C are schematic top (plan) and bottom views schematically showing a light emitting apparatus 240 according to a second embodiment of the present invention, respectively. FIG. 2B is a schematic cross-sectional view of the light emitting apparatus 240 taken along the line B-B shown in FIG. 2A.

As shown in FIGS. 2A to 2C, the light emitting apparatus 240 according to the second embodiment includes a package for light emitting apparatus 140 shown in FIGS. 2A to 2C, light emitting devices 31 and 32, and a sealing member 50. The light emitting devices are arranged in the package for light emitting apparatus, and are covered with the sealing member. The sealing member 50 according to this embodiment contains phosphor 60. However, the phosphor may be omitted. In the package 140 and the light emitting apparatus 240, main structures other than the shapes of the leadframes are substantially similar to the first embodiment. Therefore, components according to the second embodiment substantially similar to the first embodiment are attached with the same reference signs as the first embodiment, and their description is omitted.

The package 140 shown in FIG. 2A to 2C is a modified embodiment from the package 100 according to the first embodiment. Instead of the third and fourth extension portions 113 and 124, the third leadframe 13 includes first and second embedded extension portions 133 and 134.

As shown in FIGS. 2A to 2C, the package 140 has a long shape extending in one direction as viewed in plan view. In other words, the package 140 has a long-length direction and a short-length direction perpendicular to the long-length direction as viewed in plan view. The package 140 includes first, second and third leadframes 11, 12 and 13, and a resin portion 20 that is integrally formed with the first, second and third leadframes. The first and second leadframes 11 and 12 are arranged on the both sides in the long-length direction of the package 100. The third leadframe 13 is arranged between the first and second leadframes 11 and 12. The first, second and third leadframes 11, 12 and 13 are spaced away from each other so that a spaced area 15 is formed. The spaced area is filled with the resin portion 20. The spaced area 15 serves as an electrically insulating area. Thus, the leadframes are integrally held with the resin portion 20. The recessed portion 25 for accommodating light emitting devices 31 and 32 is formed by the resin portion 20 together with the first, second and third leadframes 11, 12 and 13. Specifically, the bottom surface of the recessed portion 25 is mainly formed by the upper surfaces of the first, second and third leadframes 11, 12 and 13, and the surface of the resin portion 20 with which the spaced area 15 is filled. The side wall surfaces of the recessed portion 25 are formed by the surfaces of the resin portion 20.

In the package 140 shown in FIGS. 2A to 2C, the third leadframe 13 includes a first embedded extension portion 133 that extends between the first and third leadframes 11 and 13, and has a width smaller than the maximum width of the third leadframe. The first embedded extension portion is embedded in the resin portion 20 so that the first embedded extension portion is exposed neither on the exterior side of the package 140 nor in the recessed portion 25. In addition, the third leadframe 13 includes a second embedded extension portion 134 that extends between the second and third leadframes 12 and 13, and has a width smaller than the maximum width of the third leadframe. The second embedded extension portion is embedded in the resin portion 20 so that the second embedded extension portion is exposed neither on the exterior side of the package 140 nor in the recessed portion 25. More specifically, the first and second embedded extension portions 133 and 134 are embedded right under the recessed portion side wall in the resin portion 20. Since the first and second embedded extension portions 133 and 134 are provided, the first and second embedded extension portions can further reinforce the periphery of the third leadframe 13, and can enhance to further improve the resistance the package 140 to a stress that is loaded on the spaced area 15 and its surroundings. In addition, since the first and second embedded extension portions 133 and 134 are embedded in the resin portion 20 so that the first and second embedded extension portions are exposed neither on the exterior side of the package 140 nor in the recessed portion 25, a high reinforcement effect can be provided in the spaced area 15 and its surroundings. It is preferable that the first and second embedded extension portions 133 and 134 be narrower than the first and second extension portions 111 and 122, respectively, as in this embodiment. The reason is that the first and second embedded extension portions can be easily embedded in the resin portion 20. The first and second embedded extension portions 133 and 134 are not limited to this arrangement. For example, the bottom surfaces of the first and second embedded extension portions may be partially exposed to the exterior side of the package 140 (resin portion 20) or in the recessed portion 25.

The first embedded extension portion 133 may be provided in at least one of the first and third leadframes 11 and 13. Both the first and third leadframes 11 and 13 can have the first embedded extension portion. The second embedded extension portion 134 may be provided in at least one of the second and third leadframes 12 and 13. Both the second and third leadframes 12 and 13 can have the second embedded extension portion. These embedded extension portions, which are provided in the first and/or second leadframe, and/or the third leadframe, can provide an effect for improving the strength of the package 140.

In the package 140 according to this embodiment shown in FIGS. 2A to 2C, the first and second embedded extension portions 133 and 134 are provided only in the third leadframe 13. In this case, in order to provide a higher effect for reinforcing the spaced area 15 and its surroundings, the first embedded extension portion 133 preferably extends to the position that faces the first main portion 115 of the first leadframe in the short-length direction as viewed in plan view. Similarly, the second embedded extension portion 134 preferably extends to the position that faces the second main portion 125 of the second leadframe in the short-length direction as viewed in plan view. In this case, as shown in FIG. 2C, the first and second main portions 115 and 125 of the first and second leadframes can be partially cut out in order to easily form extension of the first and second embedded extension portions 133 and 134.

As for the package 100 according to the first embodiment shown in FIGS. 1A to 1O, the first and second embedded extension portion 133 and 134, which correspond to the third and fourth extension portions 113 and 124, are provided only in the first and second leadframes 11 and 12, respectively. In this case, as discussed above, it is preferable that the third leadframe 13 be interposed between the first embedded extension portion 133 and the first extension portion 111, and between the second embedded extension portion 134 and the second extension portion 122 in the short-length direction.

Third Embodiment

Figure 3A:
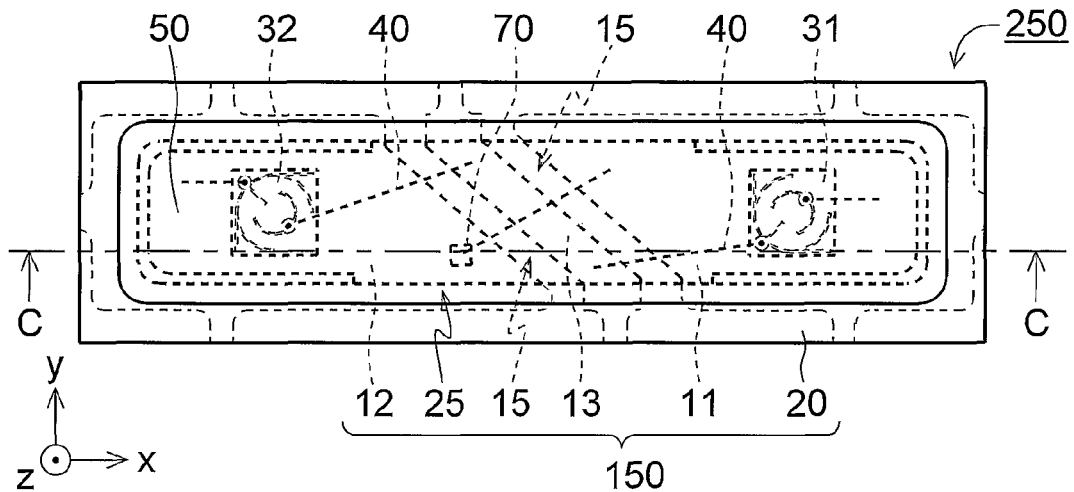
FIG. 3A is a schematic plan view schematically showing a light emitting apparatus according to an embodiment of the present invention.
Figure 3B:
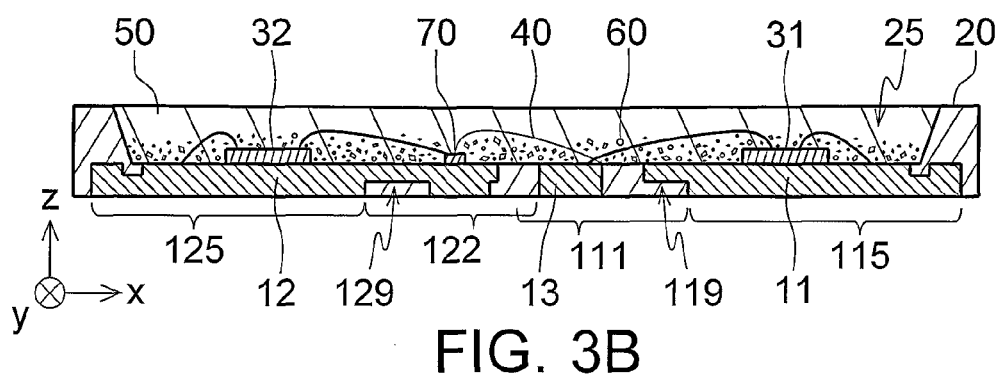
FIG. 3B is a schematic cross-sectional view of the light emitting apparatus taken along the line C-C shown in FIG. 3A.
Figure 3C:
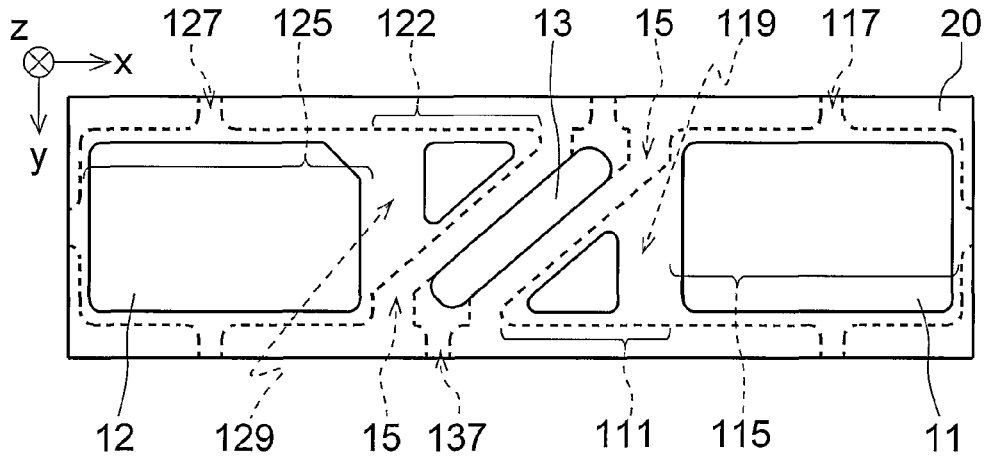
FIG. 3C is a schematic bottom view of the light emitting apparatus.

FIGS. 3A and 3C are schematic top (plan) and bottom views schematically showing a light emitting apparatus 250 according to a third embodiment of the present invention, respectively. FIG. 3B is a schematic cross-sectional view of the light emitting apparatus 250 taken along the line C-C shown in FIG. 3A.

As shown in FIGS. 3A to 3C, the light emitting apparatus 250 according to the third embodiment includes a package for light emitting apparatus 150 shown in FIGS. 3A to 3C, light emitting devices 31 and 32, and a sealing member 50. The light emitting devices are arranged in the package for light emitting apparatus, and are covered with the sealing member. The sealing member 50 according to this embodiment contains phosphor 60. However, the phosphor may be omitted. In the package 150 and the light emitting apparatus 250, main structures other than the shapes of the leadframes are substantially similar to the first embodiment. Therefore, components according to the third embodiment substantially similar to the first embodiment are attached with the same reference signs as the first embodiment, and their description is omitted.

In the package 150 shown in FIGS. 3A to 3C, the first and second extension portions 111 and 122 are tapered so that their width (length in the short-length direction) becomes smaller (is reduced) in the extension direction. In other words, the first and second extension portions 111 and 122 have an end surface that faces the third leadframe 13 and extends in a slant direction with respect to the short-length direction (also with respect to the long-length direction) as viewed in plan view. In addition, the third leadframe 13 extends along the end surface of each of the first and second extension portions 111 and 122, that is, in the slant direction with respect to the short-length direction (also with respect to the long-length direction).

In the package 150 shown in FIGS. 3A to 3C, the third leadframe 13 is interposed between the first and second extension portions 111 and 122 in the short-length direction. In this arrangement, since the third leadframe 13 overlaps the first and second leadframes 11 and 12 in the short-length direction, it promotes to improve the resistance of the package 150 to a stress that is loaded on the spaced area 15 and its surroundings (e.g., a force that is loaded on the spaced area 15 and bends the package 150). The spaced areas 15 are not limited to a straight shape that extends in the slant direction as shown in FIG. 3C. The spaced areas 15 may have a bent shape as in the first embodiment.

In the package 150 shown in FIGS. 3A to 3C, the first and second extension portions 111 and 122 face the third leadframe 13 in the slant direction with respect to the short-length direction (also with respect to the long-length direction) as viewed in plan view. In other words, the first and second extension portions 111 and 122 face the third leadframe 13 not only in the short-length direction but also in the long-length direction as viewed in plan view. Therefore, it promotes to improve the resistance of the package 150 to a stress that is loaded on the spaced area 15 and its surroundings both in the short-length and long-length directions.

Fourth Embodiment

Figure 4A:
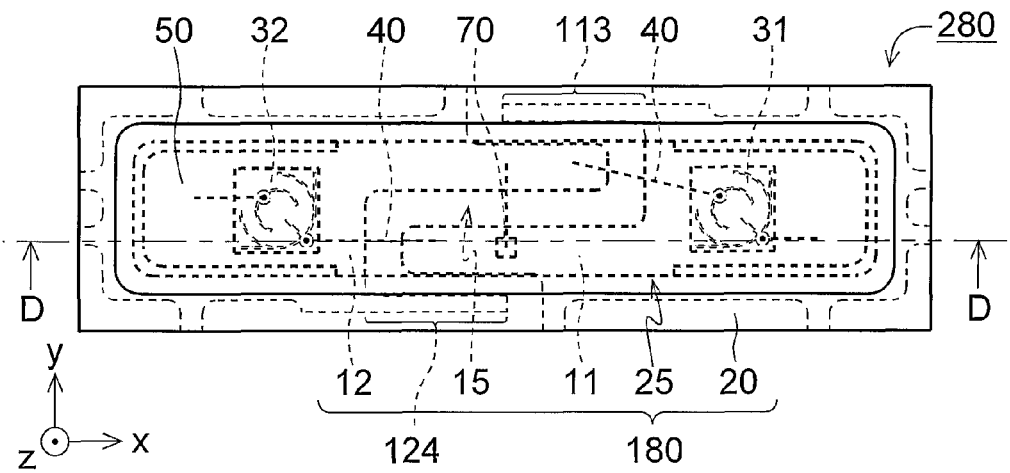
FIG. 4A is a schematic plan view schematically showing a light emitting apparatus according to an embodiment of the present invention.
Figure 4B:
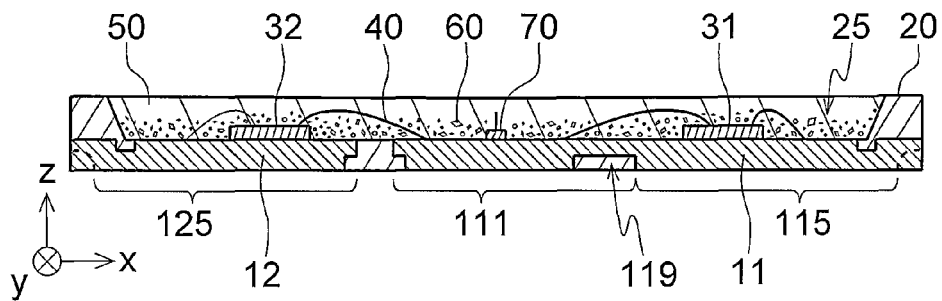
FIG. 4B is a schematic cross-sectional view of the light emitting apparatus taken along the line D-D shown in FIG. 4A.
Figure 4C:
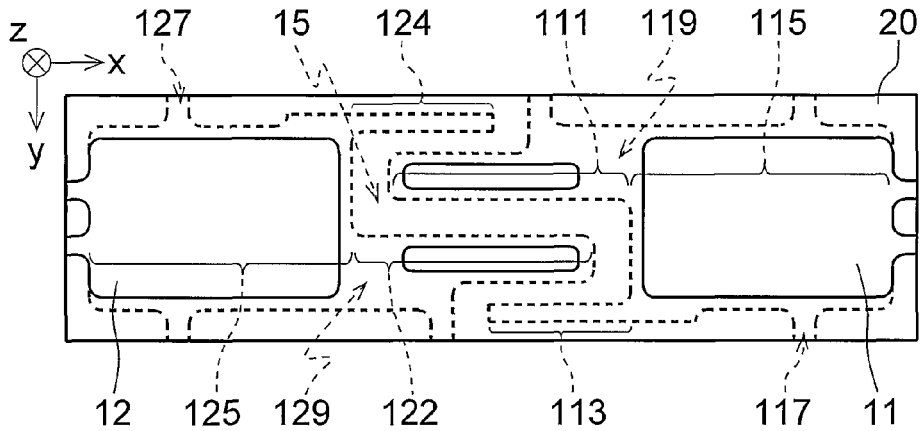
FIG. 4C is a schematic bottom view of the light emitting apparatus.

FIGS. 4A and 4C are schematic top (plan) and bottom views schematically showing a light emitting apparatus 280 according to a fourth embodiment of the present invention, respectively. FIG. 4B is a schematic cross-sectional view of the light emitting apparatus 280 taken along the line D-D shown in FIG. 4A.

As shown in FIGS. 4A to 4C, the light emitting apparatus 280 according to the fourth embodiment includes a package for light emitting apparatus 180 shown in FIGS. 4A to 40, light emitting devices 31 and 32, and a sealing member 50. The light emitting devices are arranged in the package for light emitting apparatus, and are covered with the sealing member. The sealing member 50 according to this embodiment contains phosphor 60. However, the phosphor may be omitted. In the package 180 and the light emitting apparatus 280, except that the third leadframe is not provided, main structures other than the shapes of the leadframes are substantially similar to the first embodiment. Therefore, components according to the fourth embodiment substantially similar to the first embodiment are attached with the same reference signs as the first embodiment, and their description is omitted.

As shown in FIGS. 4A to 4C, the package 180 has a long shape extending in one direction as viewed in plan view. In other words, the package 180 has a long-length direction and a short-length direction perpendicular to the long-length direction as viewed in plan view. The package 180 includes first and second leadframes 11 and 12, and a resin portion 20 that is integrally formed with the first and second leadframes. The first and second leadframes 11 and 12 are arranged on the both sides in the long-length direction of the package 180. The first and second leadframes 11 and 12 are spaced away from each other so that a spaced area 15 is formed. The spaced area is filled with the resin portion 20. The spaced area 15 serves as an electrically insulating area. Thus, the leadframes are integrally held with the resin portion 20. The recessed portion 25 for accommodating light emitting devices 31 and 32 is formed by the resin portion 20 together with the first and second leadframes 11 and 12. Specifically, the bottom surface of the recessed portion 25 is mainly formed by the upper surfaces of the first and second leadframes 11 and 12, and the surface of the resin portion 20 with which the spaced area 15 is filled. The side wall surfaces of the recessed portion 25 are formed by the surfaces of the resin portion 20.

In the package 180 shown in FIGS. 4A to 4C, the first leadframe 11 includes the first main portion 115, and a third extension portion 113 that extends from the first main portion 115 toward the second leadframe 12, and has a width smaller than the main portion of the first leadframe. The third extension portion is embedded in the resin portion 20 so that the third extension portion is exposed neither on the exterior side of the package 180 nor in the recessed portion 25. Also, the second leadframe 12 includes the second main portion 125, and a fourth extension portion 124 that extends from the second main portion 125 toward the first leadframe 11, and has a width smaller than the main portion of the second leadframe. The fourth extension portion is in the resin portion 20 so that the fourth extension portion is exposed neither on the exterior side of the package 180 nor in the recessed portion 25. More specifically, the third and fourth extension portions 113 and 124 are embedded right under the recessed portion side wall in the resin portion 20. Since the third and fourth extension portions 113 and 124 are provided, the third and fourth extension portions can enhance to further improve the resistance the package 180 to a stress that is loaded on the spaced area 15 and its surroundings. Also, since the third and fourth extension portions 113 and 124 are embedded in the resin portion 20 so that the third and fourth extension portions are exposed neither on the exterior side of the package 180 nor in the recessed portion 25, a high reinforcement effect can be provided in the spaced area 15 and its surroundings. In addition, it is preferable that the third and fourth extension portions 113 and 124 be narrower than the first and second extension portions 111 and 122, respectively, as in this embodiment. The reason is that the third and fourth extension portions can be easily embedded in the resin portion 20. The third and fourth extension portions 113 and 124 are not limited to this arrangement. For example, the bottom surfaces of the third and fourth extension portions may be partially exposed to the exterior side of the package 180 (resin portion 20) or in the recessed portion 25.

Although the package 180 shown in FIGS. 4A to 4C includes both the third and fourth extension portions 113 and 124, the package may have only one of the third and fourth extension portions 113 and 124. In the package 180, although the third and fourth extension portions 113 and 124 are provided in the first and second leadframes 11 and 12, respectively, both the third and fourth extension portions 113 and 124 may be provided in one of the first and second leadframes 11 and 12. Also, in the package 180, although the third and fourth extension portions 113 and 124 are provided on first and second long edge sides (the second long edge side is opposite to the first long edge side) of the package 180 as viewed in plan view, respectively, the third and fourth extension portions may be provided on the same long edge side (only on the first long edge side) similar to the package 100 of the first embodiment. These extension portions, which are provided on the first and second long edge sides or only on the first long edge side, can provide an effect for improving the strength of the package 180.

In the package 180 shown in FIGS. 4A to 4C, the first leadframe 11 includes the first extension portion 111, which extends from the first main portion 115 toward the second leadframe 12, and has a width smaller than the main portion of the first leadframe. The upper surfaces of the first main portion 115 and the first extension portion 111 serve as parts of the bottom surface of the recessed portion 25. Also, the second leadframe 12 includes the second extension portion 122, which extends from the second main portion 125 toward the first leadframe 11, and has a width smaller than the main portion of the second leadframe. The upper surfaces of the second main portion 125 and the second extension portion 122 serve as parts of the bottom surface of the recessed portion 25. The first and second extension portions 111 and 122 face each other in the short-length direction as viewed in plan view. The third extension portion 113 faces the second extension portion 122 in the short-length direction as viewed in plan view, while the fourth extension portion 124 faces the first extension portion 111 in the short-length direction as viewed in plan view. According to this construction, the two extension portions 111 and 113 of the first leadframe 11, and the two extension portions 122 and 124 of the second leadframe 12 face each other so that one of the extension portions of one of the first and second leadframes is interposed between the two extension portions of another of the first and second leadframes. As a result, the spaced area 15 has a complicated shape. For this reason, it promotes to further improve the resistance of the package 180 to a stress that is loaded on the spaced area 15 and its surroundings (e.g., a force that is loaded on the spaced area 15 and bends the package 180) as compared with a shape with a linear transverse part that extends along a straight line in parallel to the short-length direction.

The upper surfaces of the first and second extension portions 111 and 122 can serve as wire connection areas through which wire lines connect the light emitting devices 31 and 32 arranged on the first and second main portions 115 and 125 of the first and second leadframes in parallel to each other. Also, the first and second extension portions 111 and 122 can serve as a mounting area for mounting a protection device or the like, and a wire connection area onto which a wire line is connected from the protection device or the like. According to this construction, the wire lines can be relatively short, which in turn can reduce light absorption by the wire lines. Therefore, this construction enhances to improve the outgoing efficiency of light. As discussed above, the upper surfaces of the first and second extension portions 111 and 122, which are arranged in proximity to the spaced area 15, serve as the wire connection areas. For this reason, it is important to improve the resistance of the package 180 to a stress that is loaded on the spaced area 15 and its surroundings from viewpoint of suppressing wire disconnection.

In the package for light emitting apparatus according to the foregoing embodiments, the length ratio of the long-length direction to the short-length direction as viewed in plan view ((size in the long-length direction (length))/(size in the short-length direction (width))) falls within the range not smaller than 1.5, preferably not smaller than 2, and more preferably not smaller than 3, for example, from viewpoint of effect for reinforcing the package. However, the present invention is not limited to the foregoing embodiments. For example, the present invention can be applied to a package for light emitting apparatus having a square shape as viewed in plan view.

Elements of the package for light emitting apparatus and the light emitting apparatus according to the present invention are now described.

(Leadframe 11, 12, 13)

The leadframe can be formed of an electrically conductive metal material that can be electrically connected to the light emitting device or the protection device. Specifically, the leadframe can be formed by subjecting a metal plate (e.g., copper, aluminum, gold, silver, tungsten, iron, nickel, cobalt, molybdenum, an alloy of at least two of them, phosphor bronze, copper containing iron, or the like) to various types of working. In addition, a coating or a light reflection film of silver, aluminum, rhodium, gold, copper, or an alloy of at least two of them can be formed on the surface of the leadframe. In particular, it is preferable that the surface of the leadframe be coated with silver, which has excellent reflection characteristics. In addition, various shapes (e.g., thinner part, recessed part, groove, through hole, etc.) in the leadframe can be formed by subjecting a plate material of the leadframe to various types of working such as presswork, rolling and etching.

(Resin Portion 20)

Examples of base materials of the resin portion can be provided by thermoplastic resins such as aliphatic polyamide resin, semi-aromatic-polyamide resin, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin and polyarylate resin, or thermosetting resins such as epoxy resin, denatured epoxy resin, silicone resin, denatured silicone resin, polybismaleimide triazine resin, polyimide resin and polyurethane resin. In addition, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chrome oxide, manganese oxide, carbon black, or the like as filler or color pigment may be contained in the base material. Most thermosetting resins become hard after cured as compared with the thermoplastic resin. For this reason, in the case of thermosetting resins, the construction of the present invention is very effective, since crack or fracture is likely to appear. Among them, epoxy resin or denatured epoxy resin is very suitable.

(Light Emitting Device 31, 32)

The light emitting device can be semiconductor light devices such as LED device and semiconductor laser (Laser Diode: LD) device. The light emitting device can have a semiconductor structure that can be formed of various types of semiconductors. A pair (positive/negative) of electrodes are formed on the semiconductor structure. In particular, the light emitting device is preferably formed of nitride semiconductors ($In_xAl_yGa_{1-x-y}N$, $0 \leq x$, $0 \leq y$, $x+y \leq 1$), which can efficiently excite phosphors. Also, the light emitting device can be gallium arsenide group light emitting devices or gallium phosphide group semiconductors capable of emitting green to red range light. In the case where the pair (positive/negative) of electrodes are formed on one surface side of the light emitting device, the light emitting device can be mounted onto the package in a face-up mounting manner with the electrodes being connected to the leadframes by wire lines. In the case where the pair (positive/negative) of electrodes are formed on opposed surfaces of the light emitting device, the bottom surface electrode is connected onto one leadframe by an electrically conductive adhesive material, and the upper surface electrode is connected to another leadframe by a wire line. The same goes for a protection device, which is described later. In the case where a metal film (e.g., silver or aluminum film) or dielectric reflection film is formed on the mounting side of the light emitting device, it promotes to improve light outgoing efficiency. One or a plurality of light emitting devices can be mounted onto a single package for light emitting apparatus. The size, shape and light emission wavelength of the light emitting devices can be suitably selected. The plurality of light emitting devices can be connected in series or in parallel to each other through the leadframe or wire lines. Also, two or three different color light emitting devices can be mounted on a single package for light emitting apparatus. For example, the two different color light emitting devices can be blue and red, or blue and green light emitting devices. The three different color light emitting devices can be blue, green and red light emitting devices. When three or more light emitting devices are provided, the light emitting devices can be arranged on the extension portion(s) (first and/or third extension portion(s)) of the first leadframe and/or the extension portion(s) (second and/or fourth extension portion(s)) of the second leadframe, and/or the third leadframe, for example.

(Wire Line 40)

The wire line serves as an electric conductor for connecting the electrode of the light emitting device or the protection device to the leadframe. Specifically, the wire line can be a metal wire line of gold, copper, silver, platinum, aluminum, or an alloy at least two of them. In particular, a gold wire line is preferably used which is resistance to disconnection due to a stress from the sealing member, and has excellent in thermal resistance, and the like. In addition, the surface of the wire line may be coated with silver in order to improve light reflection characteristics.

(Sealing Member 50)

The sealing member serves a protection member that covers the light emitting devices, the protection device, the wire lines and the like, and protects them from dust, moisture, external force and the like. The sealing member can be formed of an electrically insulating base material that is transparent to the light that is emitted from the light emitting device (preferably has transmittance of not less than 70%). Examples of the base material of the sealing member can be provided by silicone resin, epoxy resin, phenol resin, polycarbonate resin, acrylate resin, TPX resin, polynorbornene resin, denatured resin obtained by denaturing them, and hybrid resin containing one or more types of these resins. The base material of the sealing member may be glass. In particular, it is preferable that the base material of the sealing member be silicone resin. The reason is that silicone resin has good heat resistance and good light resistance, and that the volumetric shrinkage of silicone resin is small after solidified. In addition, the sealing member can contain various types of functional particles (e.g., filler, phosphor, and the like) that are mixed into the base material. A diffusing agent, a coloring agent, and the like can be used as the filler. Examples of the filler can be provided by silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, carbon black, and the like. The filler can have granular shapes or spherical shapes. The filler can be hollow particles or porous particles.

(Phosphor 60)

The phosphor absorbs at least part of the primary light emitted from the light emitting device, and emits secondary light with different wavelength from the primary light. Examples of the phosphors can be provided by yttrium aluminum garnet (YAG) activated by cerium, calcium aluminosilicate ($CaO—Al_2O_3—SiO_2$) containing nitrogen activated by europium and/or chromium, silicate (($Sr, Ba)_2SiO_4$) activated by europium, potassium silicofluoride activated by manganese ($K_2SiF_6$:Mn), and the like. According to this construction, it promotes to provide a light emitting apparatus that can emit primary light with a visible wavelength and secondary light with another visible wavelength whereby emitting mixed color light (e.g., white-range light). Also, it promotes to provide a light emitting apparatus that can emit secondary light with a visible wavelength, which is excited by primary light with an ultraviolet wavelength. The phosphor may be mainly located in the lower part of the recessed part, or be distributed in the entire recessed part of the package.

(Protection Device 70)

The protection device serves to protect the light emitting device from static damage or high-voltage surge. Specifically, a Zener diode can be used as the protection device. The protection device can be covered with a light reflection member such as white resin in order to suppress light absorption.

(Adhesive Member)

An adhesive member (not shown) serves to fix the light emitting device or the protection device onto the leadframe. Electrically insulating adhesive members can be used. Examples of electrically insulating adhesive members can be provided by epoxy resin, silicone resin, polyimide resin, denatured resin obtained by denaturing them, and hybrid resin containing at least two of these resins. Electrically conductive adhesive members may be used. Examples of electrically conductive adhesive members can be provided by electrically conductive paste such as silver, gold and palladium, solder such as gold-tin group solder, and wax material such as low melting point metal.

EXAMPLE(S)

The following description will describe a light emitting apparatus according to an example of the present invention. Needless to say, the present invention is not limited to the example described below.

Example 1

The light emitting apparatus according to an example 1 is a SMD type LED that emits light upward and has the structure as the light emitting apparatus 200 according to the embodiment shown in FIGS. 1A to 1C.

The package 100 has a rectangular box shape with length of 7.0 mm, width of 2.0 mm and thickness of 0.6 mm. The resin portion 20 is integrally formed with the first, second and third leadframes 11, 12 and 13. The first and second leadframes serve as the positive and negative electrodes. The third leadframe is interposed between the first and second leadframes. A machined metal plate is first placed into a die. The metal plate includes a plurality of sets of first, second and third leadframes 11, 12 and 13, which are aligned in the long-length and short-length directions and connected to each other through hanger leads. The hanger leads serve as the hanger lead portions after the metal plate is divided into sets of the first, second and third leadframes. Subsequently, a resin material of the resin portion 20 with fluidity is injected into the die. After the resin material is solidified, the leadframes with the resin material are removed from the die. The leadframes with the resin material are divided into the packages 100. Thus, the packages are produced.

The first, second and third leadframes 11, 12 and 13 have a plate-shaped piece made of copper alloy with maximum thickness of 0.2 mm. The surfaces of the first, second and third leadframes are plated with silver. The first leadframe 11 mainly (except the hanger lead portions 117) includes the first main portion 115, the first extension portion 111, and the third extension portion 113. The first main portion 115 has a rectangular shape with transverse length (length) of 2.2 mm and height (width) of 1.5 mm as viewed in plan view. The first extension portion 111 is arranged on one end part in the short-length direction (vertical direction in FIG. 1C) of the first main portion 115, and extends from the first main portion 115 toward the second leadframe 12. The first extension portion has a rectangular shape with transverse length (length) of 1 mm and height (width) of 0.73 mm as viewed in plan view. The third extension portion 113 is arranged on another end part in the short-length direction (vertical direction in FIG. 1C) of the first main portion 115, and extends from the first main portion 115 toward the second leadframe 12. The first extension portion has a rectangular shape with transverse length (length) of 0.6 mm and height (width) of 0.15 mm as viewed in plan view. The second leadframe 12 mainly (except the hanger lead portions 127) includes the second main portion 125, the second extension portion 122, and the fourth extension portion 124. These portions have substantially similar shapes to the first leadframe 11. The second leadframe 12 is substantially symmetrical to the first leadframe 11 with respect to the center line of the package 100. The third leadframe 13 is a single isolated part, which mainly (except the hanger lead portions 137) has a rectangular shape with transverse length (length) of 1.7 mm and height (width) of 0.29 mm as viewed in plan view. The third leadframe 13 is arranged substantially in the center of the package 100.

The first and second extension portions 111 and 122 face parts of the third leadframe 13 in the short-length direction as viewed in plan view. The first and second extension portions 111 and 122 are arranged on the same side in the short-length direction that is opposite to the third leadframe 13. The third leadframe 13 is interposed between the first and third extension portions 111 and 113 in the short-length direction. The third leadframe 13 is interposed between the second and fourth extension portions 122 and 124 in the short-length direction. The width (long-length direction) of the spaced area 15 between the first and second extension portions 111 and 122 is 0.3 mm. The width (long-length direction) of the spaced area 15 between the first main portion 115 of the first leadframe and the third leadframe 13 is 0.3 mm. Also, the width (long-length direction) of the spaced area 15 between the second main portion 125 of the second leadframe and the third leadframe 13 is 0.3 mm. The width (short-length direction) of the spaced area 15 between the first extension portion 111 and the third leadframe 13 is 0.2 mm. Also, the width (short-length direction) of the spaced area 15 between the second extension portion 122 and the third leadframe 13 is 0.2 mm. The interval (short-length direction) between the third extension portion 113 and the third leadframe 13 is 0.2 mm. The interval (long-length direction) between the third extension portion 113 and the hanger lead portion 137 of the third leadframe is 0.2 mm. Also, the interval between the fourth extension portion 124 and the third leadframe 13 is 0.2 mm. The spaced area 15 of the leadframe is formed by blanking by using a press.

The resin portion 20 has a rectangular exterior shape having a transverse length of 7.0 mm and a height of 2.0 mm as viewed in plan view, and has a maximum thickness of 0.6 mm. The resin portion is formed of an epoxy resin containing titanium oxide. The recessed portion 25 is formed in roughly the central part on the top surface side of the resin portion 20, and has a transverse length of 6.4 mm, a height of 1.4 mm and a depth of 0.4 mm. The recessed portion has a rectangular shape as viewed in plan view. The four corners of the recessed portion are rounded. The inclination angle of the side wall surface of the recessed portion 25 is approximately 25 degrees with respect to the vertical line from the bottom surface of the recessed portion 25. The third and fourth extension portions 113 and 124 are embedded in the resin portion 20. That is, the third and fourth extension portions are arranged outside the recessed portion 25, and are not exposed in the recessed portion 25. The bottom surface of the recessed portion 25 is defined by the upper surfaces of the first main portion 115 and the first extension portion 111 of the first leadframe 11, the second main portion 125 and the second extension portion 122 of the second leadframe, and the third leadframe, as well as by the surface of the resin portion 20 with which the spaced area 15 between the leadframes is filled. The recessed parts are formed in parts of the upper surfaces of the first and second leadframes 11 and 12 that correspond to the boundaries between the bottom surface of the recessed portion 25 and the side wall surfaces of the recessed portion 25. The recessed parts have a width of 0.12 mm and a depth of 0.09 mm. The recessed parts are also filled with the resin portion 20. The bottom surfaces of the first, second and third leadframes 11, 12 and 13 are substantially coplanar with the bottom surface of the resin portion 20. The bottom surface of the package 100 is defined by the bottom surfaces of the first, second and third leadframes 11, 12 and 13 together with the bottom surface of this resin portion 20. Also, the recessed part 119 is formed in the bottom surface of the first extension portion 111 close to the first main portion 115, and has a transverse length (length) of 0.5 mm, height (width) of 0.73 mm, and a depth of 0.13 mm. Similarly, the recessed part 129 is also formed in the bottom surface of the second extension portion 122. The recessed parts 119 and 129 are filled with the resin portion 20. Accordingly, the exposed area of the bottom surface of the first extension portion 111 is separated from the exposed area of the bottom surface of the first main portion 115 by the resin portion 20 with which the recessed part 119 is filled. Also, the exposed area of the bottom surface of the second extension portion 122 is separated from the exposed area of the bottom surface of the second main portion 125 by the resin portion 20 with which the recessed part 129 is filled. The exposed areas of the bottom surfaces of the main portions of the first and second leadframes 11 and 12 have a rectangular shape the four corners of which are rounded as viewed in plan view. One corner of the exposed area of the bottom surface of the second main portion 125 of the second leadframe 12 is cut out for polarity distinction. In addition, the recessed parts with width of 0.1 mm and depth of 0.13 mm are formed in the peripheral parts of the bottom surfaces of the first, second and third leadframes 11, 12 and 13. The recessed parts are also filled with the resin portion 20. The recessed parts are formed by etching. The hanger lead portions 117 and 127 of the first and second leadframes are exposed in the end surfaces in the long-length direction of the package 100. The hanger lead portions 117, 127 and 137 of the first, second and third leadframes are exposed in the end surfaces in the short-length direction of the package 100. The central part of the hanger lead portion 137 of the third leadframe is cut out so that two extension parts of the hanger lead portion are formed.

The light emitting devices 31 and 32 are fixed on the upper surfaces of the first and second leadframes 11 and 12, respectively, which serve as parts of the bottom surface of the recessed portion 25 of the package 100, by silicone resin, which is an electrically insulating adhesive member. The light emitting devices 31 and 32 are an LED device that is constructed of n-type, active and p-type nitride semiconductor layers that are laminated on one after another in this order on a sapphire substrate, and can emit blue light (center wavelength of approximately 455 nm). The LED devices have a height of 650 μm, a transverse length of 650 μm and a thickness of 150 μm. The center-to-center dimension between the two light emitting devices 31 and 32 is 4.0 mm. One of the p- and n-electrodes of the light emitting device 31 or 32 is connected through the wire line 40 to the leadframe that holds this light emitting device, while another of the p- and n-electrodes of this light emitting device is connected through the wire line 40 to the upper surface of the third leadframe 13. The two light emitting devices 31 and 32 are connected in series to each other. The wire lines 40 are formed from a gold wire line with diameter of 25 μm.

In addition, a Zener diodes as the protection device is fixed on the upper surface of the first extension portion 111 by an electrically conductive adhesive member, and has a height of 150 μm, a transverse length of 150 μm and a thickness of 85 μm. The protection device includes electrodes that are arranged on the opposed surfaces of the protection device. In addition, the upper surface electrode of the protection device 70 is connected to the upper surface of the second extension portion 122 through the wire line 40.

The recessed portion 25 of the package 100 accommodates the aforementioned two light emitting devices 31 and 32, and the protection device 70, and is filled with the sealing member 50 to cover the devices. The sealing member 50 contains silicone resin as base material, and a phosphor 60 of yttrium aluminum garnet that is activated by cerium (YAG:Ce), and a filler of silica. The top surface of the sealing member 50 is substantially coplanar with the top surfaces of the recessed portion side walls of the resin portion 20, and is substantially flat. When the sealing member 50 has fluidity, the recessed portion 25 of the package 100 is filled with the sealing member by a dispenser. After that, the sealing member is solidified by heating, or the like. The phosphor 60 settles in the bottom surface side of the recessed portion 25.

COMPARATIVE EXAMPLE 1

A light emitting apparatus according to a comparative example 1 is a SMD type LED that emits light upward and has a similar structure to the light emitting apparatus according to the example 1 except that the third and fourth extension portions 113 and 124 are not provided in the first and second leadframes 11 and 12 in the light emitting apparatus according to the example 1, and that the height (the width in the short-length direction: except the hanger lead portion 137) of the third leadframe 13 is correspondingly increased (approximately twice the height of the third leadframe according to the example 1).

COMPARATIVE EXAMPLE 2

A light emitting apparatus according to a comparative example 2 is a SMD type LED that emits light upward and has a similar structure to the light emitting apparatus according to the comparative example 1 except that the second extension portion 124 is not provided in the second leadframe 12, and that the length of the first extension portion 111 of the first leadframe 11 is correspondingly increased in the transverse direction (extends to a position corresponding to the end surface of third leadframe 13).

Figure 5:
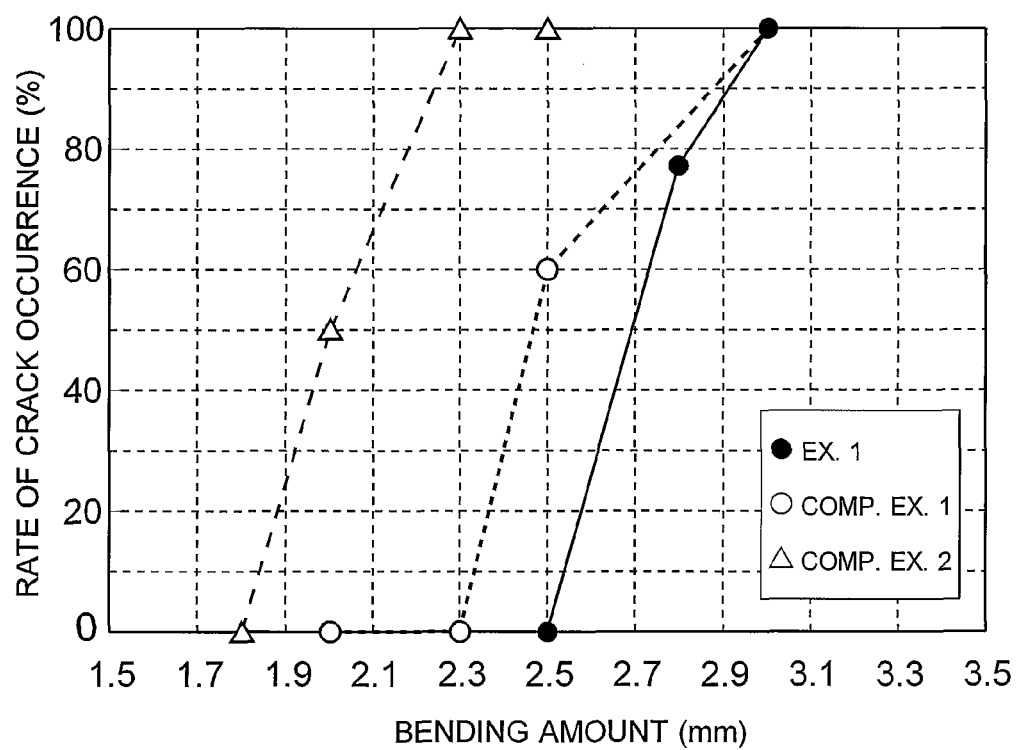
FIG. 5 is a graph showing the result of a mount bending test for the light emitting apparatus according to an example of the present invention.

The light emitting apparatus 200 according to the example 1 can emit light in luminous flux of 103 lumens (chromaticity (x, y)=(0.275, 0.247)) at 150 mA of forward current and forward voltage of 6.3 V. FIG. 5 is a graph showing the result of a mount bending test for the light emitting apparatus 200 according to the example 1 of the present invention. In the mount bending test, the light emitting apparatus is installed on a glass epoxy board (FR-4) with thickness of 1.6 mm, and the back surface of the board is pressed for five seconds. As can be seen from FIG. 5, the rates of crack occurrence of the resin portion at the mount bending amount of 2.5 mm are 60%, 100%, and 0% in the light emitting apparatuses according to the comparative example 1, the light emitting apparatus according to the comparative example 2, and the light emitting apparatus 200 according to the example 1, respectively. According to this result, it can be understood that the resistance to a stress in the light emitting apparatus 200 according to the example 1 is improved and more reliable as compared with the light emitting apparatuses according to the comparative examples 1 and 2.

The aforementioned package and the light emitting apparatus according to the example 1 have similar effects to the package 100 and the light emitting apparatus 200 according to the first embodiment. In addition, the rates of crack occurrence in the package 150 and the light emitting apparatus 250 according to the second embodiment can be further reduced in the similar mount bending test.

A package for light emitting apparatus according to the present invention can be suitably used for packages of SMD type LEDs. Also, a light emitting apparatus including the package can be used as back light source for liquid crystal display, various types of lighting apparatuses, large size display, and various types of displays for advertisement, information sign, etc., as well as image scanner for digital video camera, facsimile, copier, scanner, etc., projector, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2013-136421 filed in Japan on Jun. 28, 2013, and No. 2014-090906 filed in Japan on Apr. 25, 2014, the contents of which are incorporated herein by references.

What is claimed is:

1. A package for light emitting apparatus having a long-length direction and a short-length direction perpendicular to the long-length direction as viewed in plan view, the package for light emitting apparatus comprising:
    first and second leadframes that are arranged on the both sides in said long-length direction; and
    a resin portion that is integrally formed with said first and second leadframes,
    wherein a recessed portion for accommodating a light emitting device is formed by said resin portion, and said first and second leadframes,
    wherein said first leadframe includes
    a main portion, and
    a third extension portion that extends from said main portion toward said second leadframe and has a width reduced from the main portion, wherein the third extension portion is embedded in said resin portion so that the third extension portion is exposed neither on the exterior side of the package nor in said recessed portion.

2. The package for light emitting apparatus according to claim 1, wherein said second leadframe includes a main portion, and a fourth extension portion that extends from said main portion toward said first leadframe and has a width reduced from the main portion, wherein the fourth extension portion is embedded in said resin portion so that the fourth extension portion is exposed neither on the exterior side of the package nor in said recessed portion.

3. The package for light emitting apparatus according to claim 2 further comprising a third leadframe that is arranged between said first and second leadframes, wherein the bottom surface of said recessed portion is formed by the first, second and third leadframes,
   wherein said third and fourth extension portions face said third leadframe in said short-length direction as viewed in plan view.

4. The package for light emitting apparatus according to claim 3, wherein said first leadframe includes a first extension portion that extends from said main portion toward said second leadframe and has a width reduced from the main portion,
   wherein said second leadframe includes a second extension portion that extends from said main portion toward said first leadframe and has a width reduced from the main portion,
   wherein said third leadframe is interposed between said first and third extension portions in said short-length direction,
   wherein said third leadframe is interposed between said second and fourth extension portions in said short-length direction.

5. The package for light emitting apparatus according to claim 4, wherein the widths of said third and fourth extension portions are smaller than said first and second extension portions, respectively.

6. A light emitting apparatus comprising:
   the package for light emitting apparatus according to claim 4;
   a first light emitting device that is arranged on the upper surface of said main portion of said first leadframe; and
   a second light emitting device that is arranged on the upper surface of said main portion of said second leadframe.

7. The light emitting apparatus according to claim 6, wherein said first and second light emitting devices are connected to the upper surface of said third leadframe through wire lines.

8. The light emitting apparatus according to claim 6, further comprising a protection device that is arranged on the upper surface of said first extension portion, and is connected to the upper surface of said second extension portion through a wire line.

9. The package for light emitting apparatus according to claim 3, wherein said third leadframe is arranged substantially in the center of the package for light emitting apparatus in said long-length direction.

10. The package for light emitting apparatus according to claim 3, wherein the bottom surfaces of said first, second and third leadframes serve together with the bottom surface of said resin portion as the bottom surface of the package for light emitting apparatus.

11. The package for light emitting apparatus according to claim 2, wherein said first leadframe includes a first extension portion that extends from said main portion toward said second leadframe and has a width reduced from the main portion,
   wherein said second leadframe includes a second extension portion that extends from said main portion toward said first leadframe and has a width reduced from the main portion,
   wherein said first and second extension portions face each other in said short-length direction as viewed in plan view,
   wherein said third extension portion faces said second extension portion in said short-length direction as viewed in plan view,
   wherein said fourth extension portion faces said first extension portion in said short-length direction as viewed in plan view.

12. The package for light emitting apparatus according to claim 11, wherein the widths of said third and fourth extension portions are smaller than said first and second extension portions, respectively.

13. The package for light emitting apparatus according to claim 1, wherein the base material of said resin portion is selected from the group consisting of epoxy resin, denatured epoxy resin, silicone resin, denatured silicone resin, polybismaleimide triazine resin, polyimide resin, and polyurethane resin.

14. The package for light emitting apparatus according to claim 13, wherein the base material of said resin portion is epoxy resin or denatured epoxy resin.

15. A package for light emitting apparatus having a long-length direction and a short-length direction perpendicular to the long-length direction as viewed in plan view, the package for light emitting apparatus comprising:
   first and second leadframes that are arranged on the both sides in said long-length direction;
   a third leadframe that is arranged between said first and second leadframes, said third leadframe having a main portion; and
   a resin portion that is integrally formed with said first, second and third leadframes,
   wherein a recessed portion for accommodating a light emitting device is formed by said resin portion together with said first, second and third leadframes,
   wherein at least one of said first and third leadframes includes a first embedded extension portion that extends from said main portion of said third leadframe toward said first leadframe and has a width smaller than the main portion of the first leadframe or the maximum width of the third leadframe, wherein the first embedded extension portion is embedded in said resin portion so that the first embedded extension portion is exposed neither on the exterior side of the package nor in said recessed portion.

16. The package for light emitting apparatus according to claim 15, wherein at least one of said second and third leadframes includes a second embedded extension portion that extends from said main portion of said third leadframe toward said second leadframe and has a width smaller than the main portion of the second lead frame or the maximum width of the third leadframe, wherein the second embedded extension portion is embedded in said resin portion so that the second embedded extension portion is exposed neither on the exterior side of the package nor in said recessed portion.

17. The package for light emitting apparatus according to claim 16, wherein only said first leadframe includes said first embedded extension portion, and
   only said second leadframe includes said second embedded extension portion.

18. The package for light emitting apparatus according to claim 17, wherein said first leadframe includes a first extension portion that extends from said main portion toward said second leadframe and has a width reduced from the main portion,
   wherein said second leadframe includes a second extension portion that extends from said main portion toward said first leadframe and has a width reduced from the main portion,
   wherein said third leadframe is interposed between said first embedded extension portion and said first extension portion in said short-length direction, wherein said third leadframe is interposed between said second embedded extension portion and said second extension portion in said short-length direction.

19. The package for light emitting apparatus according to claim 16, wherein only said third leadframe includes said first and second embedded extension portions.

20. A package for light emitting apparatus having a long-length direction and a short-length direction perpendicular to the long-length direction as viewed in plan view, the package for light emitting apparatus comprising:

first and second leadframes that are arranged on the both sides in said long-length direction;

a third leadframe that is arranged between said first and second leadframes; and a resin portion that is integrally formed with said first, second and third leadframes, wherein said first leadframe includes a main portion, and a first extension portion that extends from said main portion toward said second leadframe and has a width reduced from the main portion, wherein said second leadframe includes a main portion, and a second extension portion that extends from said main portion toward said first leadframe and has a width reduced from the main portion, wherein said first and second extension portions face said third leadframe in said short-length direction as viewed in plan view, wherein said first and second extension portions are arranged on the same long edge side of the package as viewed in plan view, wherein said first leadframe includes a third extension portion that extends from said main portion toward said second leadframe and has a width smaller than the main portion so that said third leadframe is interposed between the first and third extension portions in said short-length direction, wherein said second leadframe includes a fourth extension portion that extends from said main portion toward said first leadframe and has a width smaller than the main portion so that said third leadframe is interposed between the second and fourth extension portions in said short-length direction, wherein a recessed portion for accommodating a light emitting device is formed by said resin portion together with said first, second and third leadframes, and wherein said third and fourth extension portions are embedded in said resin portion so that said third and fourth extension portions are exposed neither on the exterior side of the package nor in said recessed portion.

* * * * *